United States Patent [19]

Zambrano

[11] Patent Number: 5,556,792
[45] Date of Patent: Sep. 17, 1996

[54] PROCESS FOR MANUFACTURING A POWER INTEGRATED CIRCUIT ("PIC") STRUCTURE WITH A VERTICAL IGBT

[75] Inventor: Raffaele Zambrano, San Giovanni la Punta, Italy

[73] Assignee: Consorzio per la Ricerca sulla Microelecttronica nel Mezzogiorno, Catania, Italy

[21] Appl. No.: 472,196

[22] Filed: Jun. 7, 1995

Related U.S. Application Data

[62] Division of Ser. No. 443,908, May 17, 1995.

[30]    Foreign Application Priority Data

May 19, 1994 [EP] European Pat. Off. .............. 94830230

[51] Int. Cl.$^6$ ........................... H01L 21/70; H01L 49/00
[52] U.S. Cl. ................... 437/6; 437/41; 437/58; 437/154; 437/152; 148/DIG. 126
[58] Field of Search .................... 437/6, 41, 34, 437/58, 59, 152, 154, 31, 51, 57; 148/DIG. 126

[56]     References Cited

U.S. PATENT DOCUMENTS

| | | | |
|---|---|---|---|
| 4,001,860 | 1/1977 | Cauge et al. ................. | 357/23 |
| 4,072,975 | 2/1978 | Ishitani ....................... | 357/23 |
| 4,233,615 | 11/1980 | Takemoto et al. ............ | 357/22 |
| 4,344,081 | 8/1982 | Pao et al. .................... | 357/43 |
| 4,908,328 | 3/1990 | Hu et al. ................. | 148/DIG. 135 |
| 5,223,450 | 6/1993 | Fujino et al. ................. | 437/67 |
| 5,246,871 | 9/1993 | Zambrano et al. ........... | 437/51 |
| 5,300,451 | 4/1994 | Zambrano ............. | 148/DIG. 126 |
| 5,374,582 | 12/1994 | Okonogi et al. ............. | 437/67 |
| 5,453,390 | 9/1995 | Nishizawa et al. ...... | 148/DIG. 126 |

FOREIGN PATENT DOCUMENTS

| | | | |
|---|---|---|---|
| 2144909 | 6/1985 | European Pat. Off. ....... | H01L 27/06 |
| 0323843 | 7/1989 | European Pat. Off. ....... | H01L 27/06 |

OTHER PUBLICATIONS

European Search Report from European Patent Application No. 94830230.2 filed May 19 1994.
Patent Abstracts of Japan, vol. 13, No. 243 (E-768) Jun. 7, 1989 & JP-A-01 045 159 Nissan Motor Co. Ltd.
3rd International Symposium on Power Semiconductor Devices and ICA, Apr. 1991, Baltimore, Maryland pp. 40–44, T. Mizoguchi et al, "600V, 25A Dielectrically–Isolated Power IC with Vertical IGBT".
Patent Abstracts of Japan, vol. 13, No. 184 (E-751) Apr. 28, 1989 & JP-A-01 010 658 Nissan Motor Co. Ltd.
Patent Abstracts of Japan, vol. 14, No. 324 (E-951) (4267) Jul. 11, 1990 & JP-A-02 109 371 Hitachi Ltd.
Patent Abstracts of Japan, vo. 11, No. 376 (E-563) (2823) Dec. 8, 1987 & JP-A-62 143 450 Hitachi Ltd.

*Primary Examiner*—Tuan H. Nguyen
*Attorney, Agent, or Firm*—David M. Driscoll; James H. Morris

[57]     ABSTRACT

A PIC structure includes a lightly doped semiconductor layer of the first conductivity type superimposed over a heavily doped semiconductor substrate of a second conductivity type, wherein a Vertical IGBT and a driving and control circuit including at least first conductivity type-channel MOSFETs are integrated. The MOSFETs are provided inside well regions of the second conductivity type which are included in at least one lightly doped region of the first conductivity type completely surrounded and isolated from the lightly doped layer of the first conductivity type by means of a respective isolated region of a second conductivity type.

10 Claims, 5 Drawing Sheets

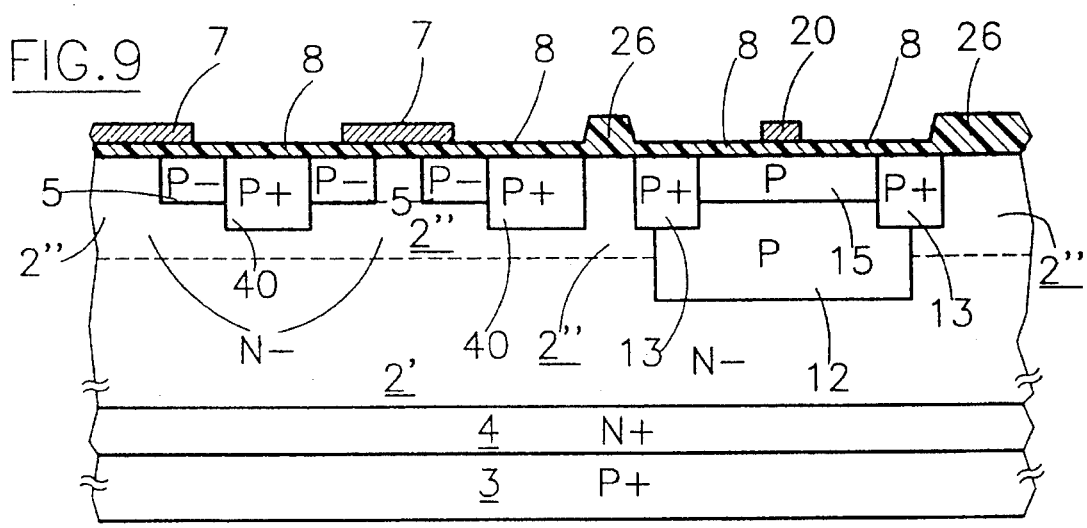
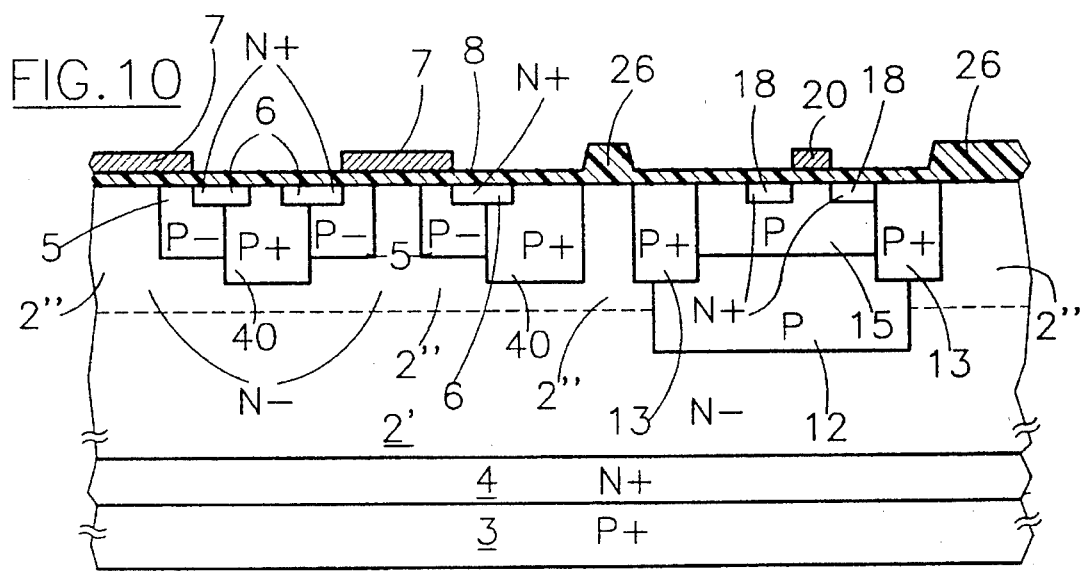
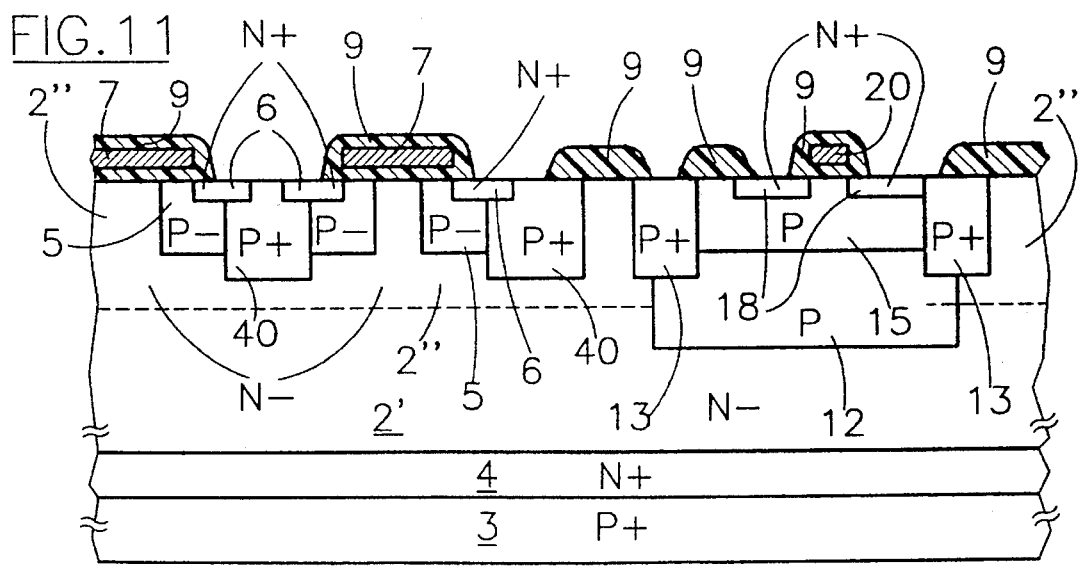

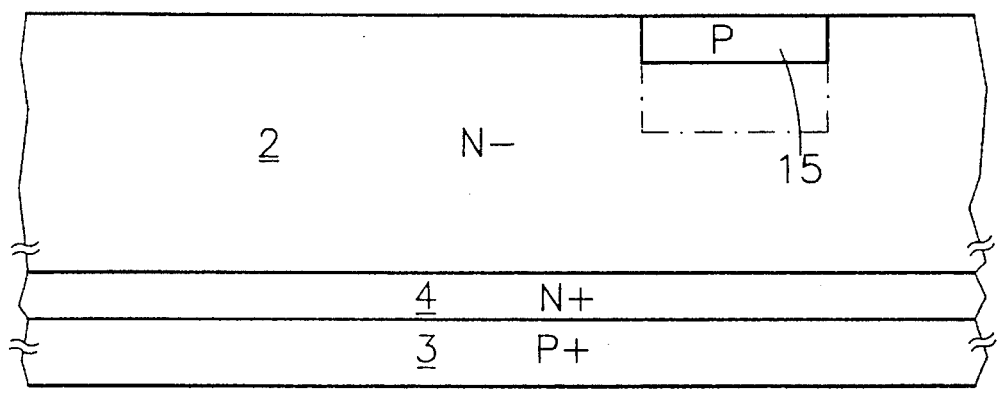
FIG.12
FIG.13
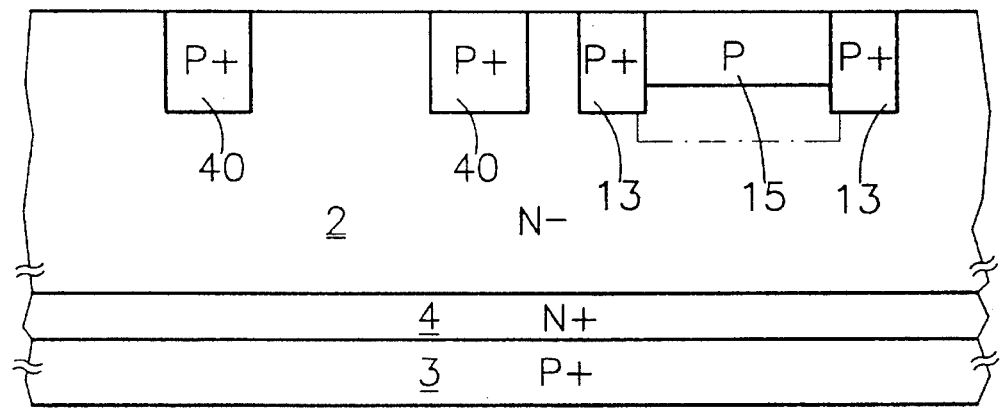
FIG.14
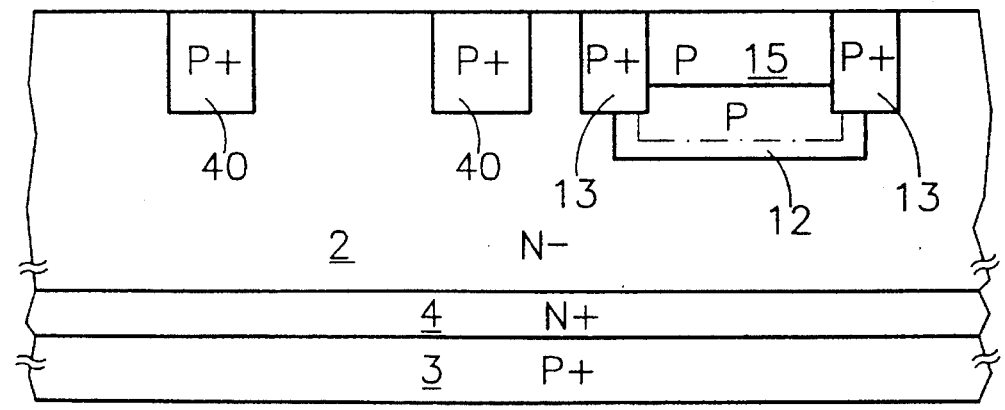

PROCESS FOR MANUFACTURING A POWER INTEGRATED CIRCUIT ("PIC") STRUCTURE WITH A VERTICAL IGBT

This application is a division of application Ser. No. 08/443,908, filed May 17, 1995, entitled POWER INTEGRATED CIRCUIT ("PIC") STRUCTURE WITH A VERTICAL IGBT, AND MANUFACTURING PROCESS THREOF, now pending.

BACKGROUND OF THE INVENTION

1. Field of the Invention

The present invention relates to a Power Integrated Circuit ("PIC") structure featuring a Vertical Insulated Gate Bipolar transistor (IGBT) power stage, and to a manufacturing process thereof.

2. Discussion of the Related Art A "Power Integrated Circuit" ("PIC") is a monolithic integrated structure comprising one or more power parts ("a power stage") and a driving, control and protection circuit.

Several efforts have been made to obtain PICs with a minimum increase in the fabrication process complexity. Examples are given in the documents listed below, each of which is incorporated herein by reference:

1) J. P. Mille, Proceedings of Symposium on HV & Smart Power ICs, Los Angeles, May 1989, p. 517–525, 2) F. Goodenough, Electronic Design, Mar. 4. 1993, p. 27–28, where manufacturing processes are described for obtaining PICs featuring a vertical Double-diffused MOSFET ("VDMOSFET") and/or an NPN bipolar junction transistor power stage. The driving and control circuitry comprises N-channel MOSFETs (both enhancement- and depletion-mode); the N-channel MOSFETs of the driving and control circuitry are provided in a P type well diffused in the lightly doped N type epitaxial layer constituting, together with a heavily doped N+ silicon susbtrate, the VDMOSFET drain; the electric isolation of the driving and control circuitry from the power stage is achieved by reverse biasing the P type well/N type epitaxial layer junction (this technique is known as self-isolation).

With respect to the VDMOS manufacturing process, these structures require only the addition of a few steps, such as the definition of the P type well and of the depletion implant.

A Vertical IGBT could be integrated simply by starting the process with a P+ silicon substrate, instead of an N+ substrate, as it happens in discrete power pares.

Actually, this is a superficial approach; it is in fact known that the IGBT structure inherently includes a pair of parasitic NPN and PNP transistors connected to form a Silicon Controlled Rectifier ("SCR"); if the parasitic SCR turns on (latch-up), the PIC can malfunction and even be permanently damaged. To prevent the latch-up, the base region of the NPN parasitic BJT (i.e. the body and deep body regions of the IGBT elementary cells) is heavily doped (to reduce the gain) and is short-circuited to the emitter region (which coincides with the source regions of the IGBT elementary cells). Pairs of NPN and PNP parasitic BJTs are also associated with each N-channel MOSFET in the driving and control circuitry of the PIC; in this case the base region of the NPN parasitic BJT coincides with the P type well, which has a doping much lighter than the body and deep body regions of the IGBT elementary cells, thus the gain of the parasitic NPN is much higher, and the latch-up is harder to prevent.

In view of the state of the art just described, an object of the present invention is the integration of a Vertical IGBT in a PIC structure with driving and control circuitry comprising at least N-channel MOSFETs, overcoming at least the above mentioned drawbacks.

SUMMARY OF THE INVENTION

According to the present invention, this object and others are attained by means of a PIC structure comprising a lightly doped semiconductor layer of the first conductivity type superimposed over a heavily doped semiconductor substrate of a second conductivity type, wherein a Vertical IGBT and a driving and control circuit comprising at least first conductivity type-channel MOSFETs are integrated, wherein the MOSFETs are provided inside well regions of the second conductivity type which are included in at least one isolated lightly doped region of the first conductivity type completely surrounded and isolated from the lightly doped layer of the first conductivity type by means of a respective isolation region of a second conductivity type.

As a result of the present invention, it is possible to obtain a PIC structure with a driving and control circuit comprising at least N-channel MOSFETs isolated from the IGBT power stage. The isolation region which completely surrounds the P type well regions where the N-channel MOSFETs are integrated can have heavier doping compared to the P type well regions, to reduce the gain of the NPN parasitic transistor (BJT) and thus to prevent the parasitic SCR latch-up.

BRIEF DESCRIPTION OF THE DRAWINGS

These and other features of the present invention will be made more evident by the following detailed description of some particular embodiments, illustrated as non-limiting examples in the annexed drawings, wherein:

FIGS. 6 to 11 are cross-sectional views of the PIC structure of FIG. 1, showing intermediate steps of a manufacturing process according to the present invention;

FIGS. 12 to 14 are cross-sectional views of the PIC structure of FIG. 1, showing intermediate steps of another manufacturing process according to the present invention.

DETAILED DESCRIPTION

Figure 1:
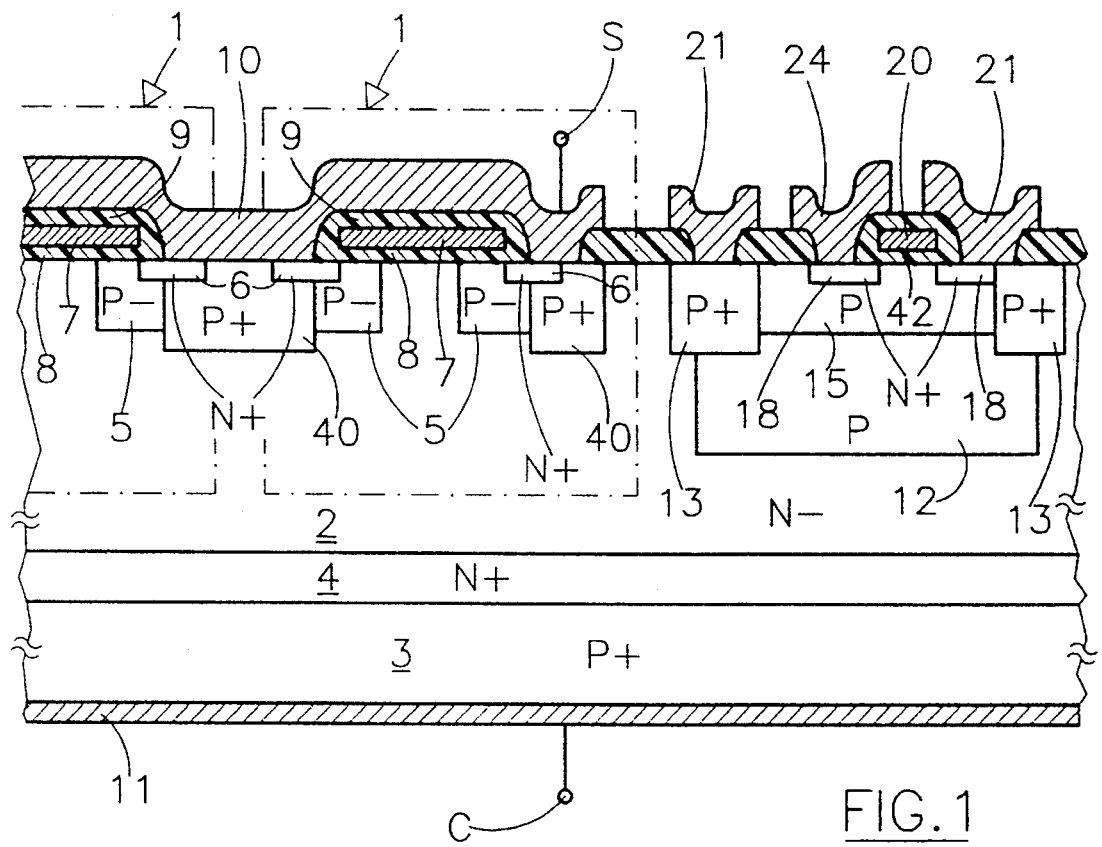
FIG. 1 is a cross-sectional view of a PIC structure according to a first embodiment of the present invention.

A PIC structure according to a first embodiment of the present invention comprises, in a first chip region, a power stage including a vertical current-flow Insulated Gate Bipolar Transistor ("IGBT") which in a per-se known way is made up of an array of elementary cells 1 provided in a lightly doped N type ("N–") epitaxial layer 2, grown over a heavily doped P type ("P+") semiconductor substrate 3 with the interposition of a heavily doped N type ("N+") buffer layer 4.

Each elementary cell 1 comprises in a per-se known way P+ deep body regions 40, lightly doped P type ("P–") body regions 5 and N+ source regions 6; a polysilicon gate 7, insulated from the top surface of the N– layer 2 by a thin gate oxide layer 8, is superimposed over the P– body regions 5, which therefore act as channel regions when a proper bias voltage is applied to the polysilicon gate 7. The polysilicon gate 7 is covered by an insulating layer 9. A metal layer 10 is superimposed over the insulating layer 9 and contacts the source regions 6 and the deep body regions 40 of all the elementary cells 1; the metal layer 10 forms a source electrode S of the IGBT. A metal layer 11 is also provided at the bottom surface of the substrate 3 to form a collector electrode C of the IGBT (FIG. 1).

A driving and control circuit is integrated in a second region of the PIC chip; in the example of FIG. 1, only an N-channel MOSFET (enhancement-mode) is shown.

The N-channel MOSFET is fabricated inside a P type well 15, provided inside an isolated portion of the N– layer 2 surrounded by a P type buried region 12, at the bottom, and, laterally, by a P+ annular region 13 which extends from the top surface of the N– layer 2 downwards and contacts the P type buried region 12. The P type well 15 extends downwards to contact the P type buried region 12.

The P type well 15 forms a channel region for the N-channel MOSFET. The P type well 15 is provided inside said isolated portion of the N– layer 2, which has a low dopant concentration; its doping level can thus be adjusted to obtain the desired threshold voltages for the N-channel MOSFET.

N+ source and drain regions 18 for the N-channel MOSFET are provided inside the P type well 15. A polysilicon gate 20, insulated from the surface of the P type well 15 by a thin gate oxide layer 42 (which can coincide with the oxide layer 8), extends between the source and drain regions 18 of the N-channel MOSFET.

The P+ region 13 is contacted by a metallization 21, which is connected to the lowest potential, so that the junction between the N– layer 2 and the P type regions 12 and 13 is reverse biased in all operating conditions; this ensures that the driving and control circuitry is electrically isolated from the IGBT. The metallization 21 also contacts the source region 18 of the N-channel MOSFET (in this embodiment the N-channel MOSFET has a grounded source, and this is the lowest potential present on the device). A metal interconnection 24 contacts the drain region 18 of the N-channel MOSFET.

Figure 2:
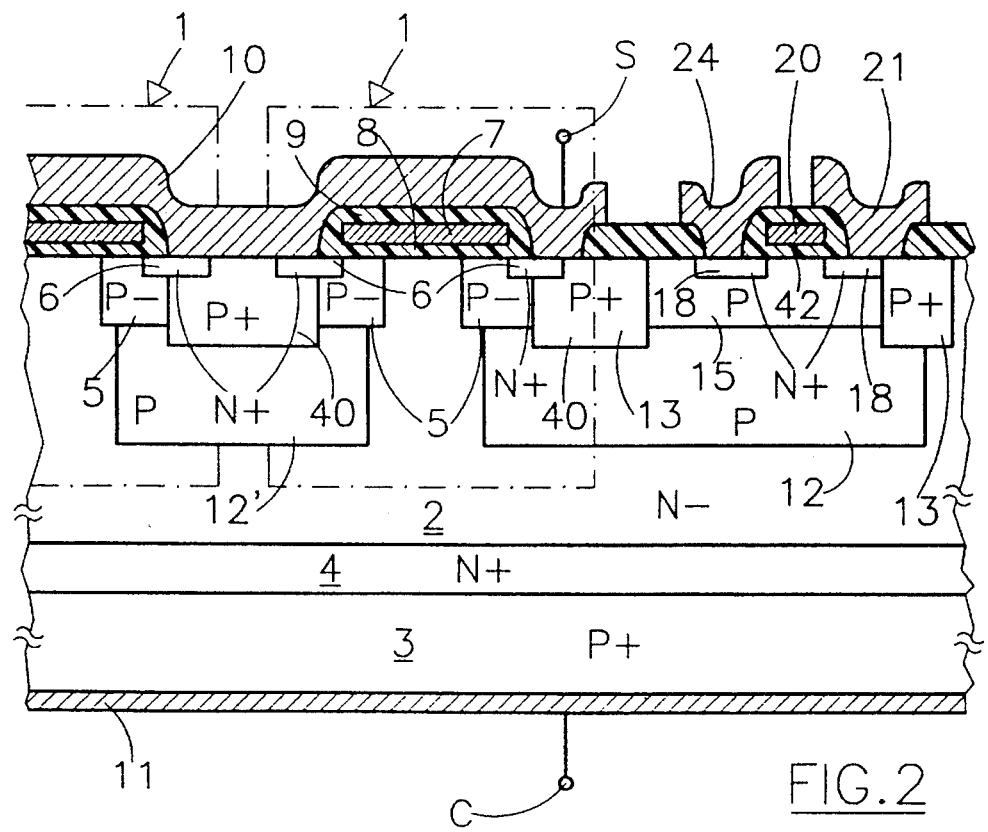
FIG. 2 is a cross-sectional view of a PIC structure according to a second embodiment of the present invention.

A second embodiment of the PIC structure according to the present invention, shown in FIG. 2, provides for increasing the compactness of the structure, especially in PICs where the power stage is designed to work as a Low Side Driver (LSD). In this case the source electrode S of the IGBT is the circuit node at the lowest potential, and then the P+ region 13 should be connected to it. This can be done by merging the P+ region 13 with the P+ deep body region 40 of at least one elementary cell 1.

Incidentally, P type buried regions 12' can also be defined under the P+ deep body regions 40 of the elementary cells 1, to reduce the gain and the base extrinsic resistance (rbb') of the parasitic NPN transistor associated with each of them and having emitter, base and collector respectively represented by the N+ source regions 6, the P body regions 5 and the P+ deep body regions 40, and the N type layer 2 and the N+ buffer layer 4.

Figure 3:
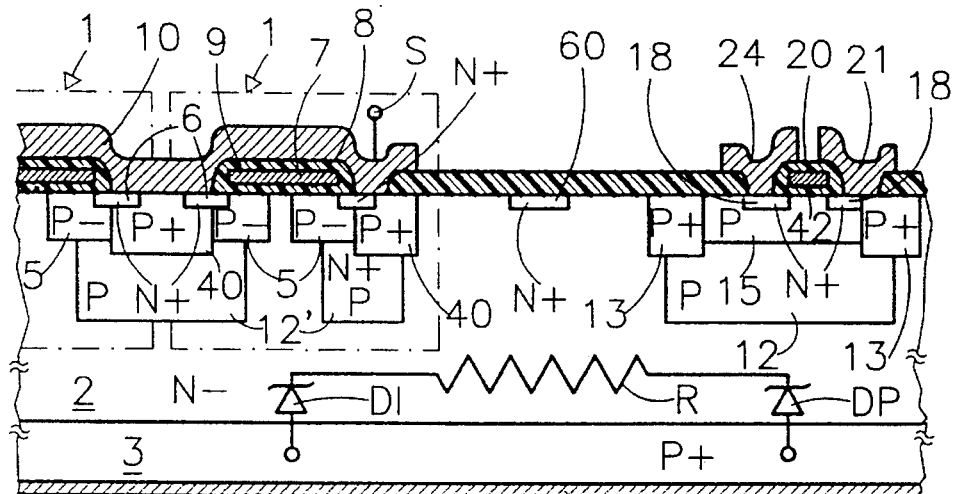
FIG. 3 is a cross-sectional view of a PIC structure according to a third embodiment of the present invention.

A third embodiment of the PIC structure according to the present invention is shown in FIG. 3, it differs from the embodiment of FIG. 1 in that no N+ buffer layer 4 is provided, and the two regions where the IGBT and the driving and control circuitry are integrated are deliberately spaced apart. A resistor R is thus introduced between the portion of the N– layer 2 between the P+ substrate 3 and the IGBT elementary cells 1, and the portion of the N– layer 2 between the P+ substrate 3 and the P type buried region 12 insulating the N-channel MOSFETs of the driving and control circuitry. Due to the high resistivity of the N– layer 2, which for IGBT designed to withstand up to 8.00 V is about 10 Kohm/square, the resistor R can easily have a value of some hundreds of Ohms. In this way, the two diodes DI and DP shown in FIG. 3, formed by the P+ substrate/N– layer 2 junction respectively in the IGBT and in the driving and control circuitry regions, can be differently biased when the power device is active; in particular, it is possible to have the diode DI forward biased (with a voltage across it ranging from 0.5 to 0.8 Volts) so that conductivity modulation can effectively take place, while the diode DP (which coincides with the emitter-base junction of the parasitic PNP transistor having collector represented by the P type regions 12, 13 and 15 and forming, together with a parasitic NPN transistor, an SCR) is kept off (with a voltage across it lower than 0.4 V). A narrow channel-stop N+ region 60 prevents parasitic MOSFETs conduction in the N– layer 2 portion between the IGBT and the driving and control circuitry chip.

Figure 4:
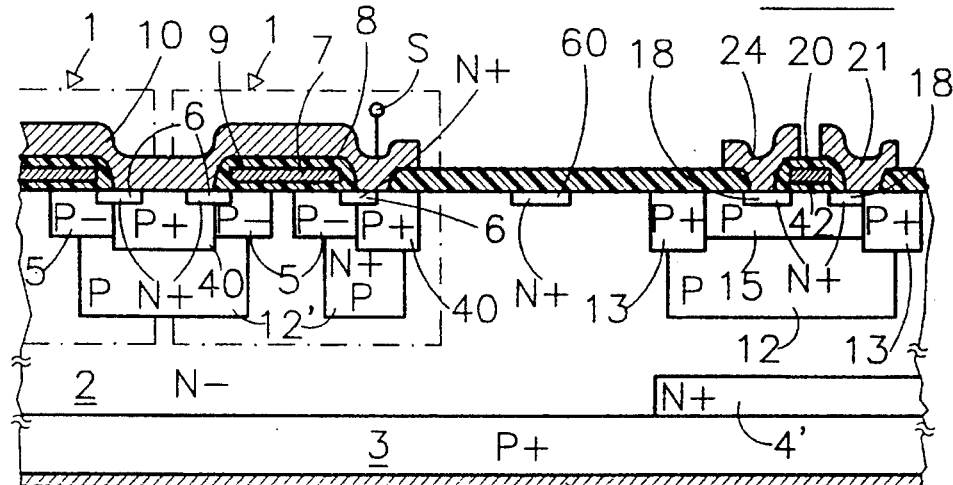
FIG. 4 is a cross-sectional view of a PIC structure according to a fourth embodiment of the present invention.

In a fourth embodiment of the PIC structure according to the invention, shown in FIG. 4, an N+ buffer layer 4' is selectively formed below the driving and control circuitry, but not below the IGBT, to reduce the gain of the parasitic NPN transistor.

Figure 5:
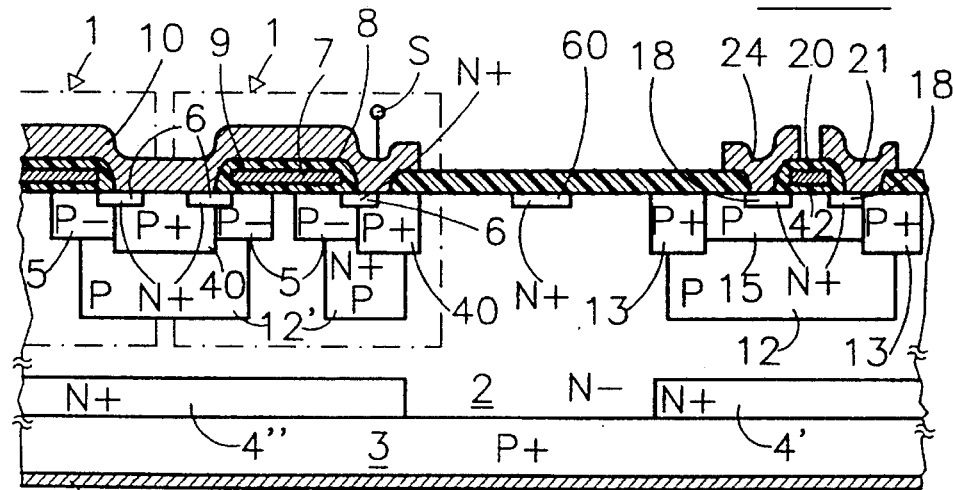
FIG. 5 is a cross-sectional view of a PIC structure according to a fifth embodiment of the present invention.

In a fifth embodiment of the PIC structure according to the invention, shown in FIG. 5, two N+ buffer layers 4' and 4" are selectively formed respectively below the driving and control circuitry and below the IGBT, but not below the N– layer 2 region in between; the N+ buffer layers 4' and 4" can have different dopant concentration, to allow an easier optimization of the device characteristics.

A manufacturing process suitable to obtain the PIC structure shown in FIG. 1 starts with the epitaxial growth of an N type layer over a P+ substrate 3 with low resistivity. The N type epitaxial layer comprises a first portion, with low thickness and medium/high dopant concentration, directly over the substrate 3 and constituting an N+ buffer layer 4, and a second portion, thicker and with low dopant concentration, constituting a first N– epitaxial layer 2'.

Figure 6:
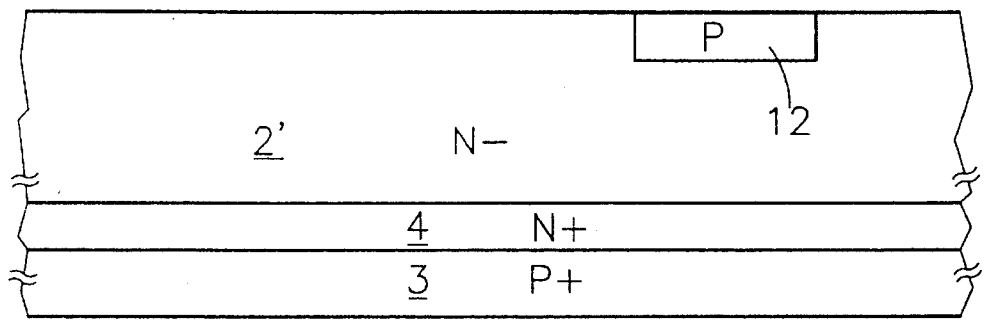

A P type dopant is then selectively introduced into the first N– epitaxial layer 2' to form at least one P type buried region 12; a conventional technique provides for the growth of an oxide layer over the first N– epitaxial layer 2', selectively removing the oxide layer from selected regions of the first N– epitaxial layer 2' surface, and then implanting and diffusing a P type dopant. The remaining oxide layer is then completely removed from the surface of the first N– epitaxial layer 2' (FIG. 6).

A second lightly doped N– layer 2" is then epitaxially grown over the first N– epitaxial layer 2'. The dopant concentration in the second N– epitaxial layer 2" can be different from the dopant concentration in the first N– epitaxial layer 2', even if of the same order of magnitude. After this step, the P type region 12 is buried beneath the second N– epitaxial layer 2".

Figure 7:
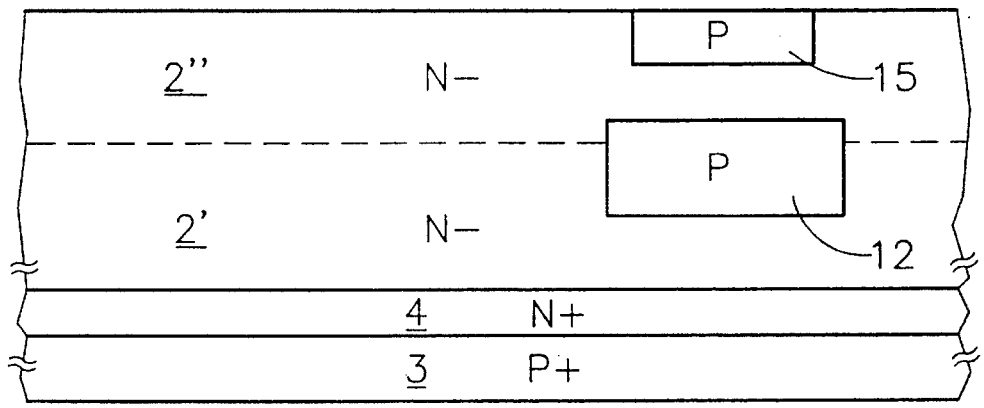

A P type dopant is then selectively introduced into the second N– epitaxial layer 2" to form P type wells 15 over the P type buried region 12 (FIG. 7). The N-channel MOSFETs of the driving and control circuitry will be integrated in the P type wells 15.

Figure 8:
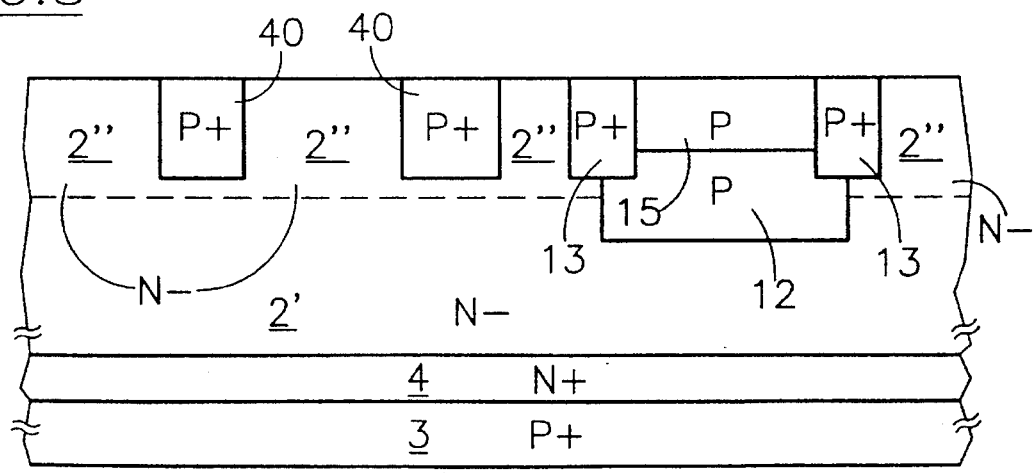

A high dose of P type dopant is selectively introduced into the second N− epitaxial layer 2" to form the P+ deep body regions 40 of the elementary cells 1, and The P+ regions 13 which, together with the P type buried region 12, define isolated portions of the second N− epitaxial layer 2", and which provide electrical contact to the P type buried region 12 (FIG. 8). In a preferred embodiment, the P+ regions 13 are defined together with the P+ deep body regions 40, simply by providing a proper layout of a litographic mask. This can be performed by growing an oxide layer over the surface of the second N− epitaxial layer 2", selectively removing the oxide layer, and implanting and diffusing a P type dopant into the second N− epitaxial layer 2". After these steps, at least one isolated portion of the second N− epitaxial layer 2" is completely surrounded and isolated from the bulk of the second N− epitaxial layer 2".

After the definition of active areas on the second N− epitaxial layer 2" surface (separated each other by a thick field oxide layer 26), a thin gate oxide layer 8 is grown on them. A polysilicon layer is then deposited over the thin gate oxide layer 8 and the field oxide layer 26.

The polysilicon layer is then selectively removed to form the gates 7 and 20 of the elementary cells 1 and of the N-channel MOSFETs of the driving and control circuitry.

A low dose of a P type dopant is selectively introduced into the second N− epitaxial layer 2" to form the P− body regions 5 of the elementary cells 1 (FIG. 9).

A high dose of an N type dopant is then selectively introduced into the P+ deep body regions 40 and the P− body regions 5 to form source regions 6 of the elementary cells 1. Said N type dopant is simultaneously introduced into the P type well 15 to form N+ source and drain self-aligned regions 18 of the N-channel MOSFETs (FIG. 10).

A passivation layer 9 (such as Phosphorous doped Silicon Glass) is then deposited, through which contact areas to the N+ source regions 6 and P+ deep body regions 40 of the elementary cells 1, to the P+ region 13, and to the source and drain regions 18 of the MOSFETs are defined (FIG. 11). A metal layer is deposited and selectively etched to form the desired pattern of interconnections 10, 21 and 24. A passivating materials (such as glass), not shown, is finally deposited over the metal interconnection layer. The bottom surface of the substrate 3 is also covered with a metal layer to provide an electrical contact to the collector region of the IGBT.

As it clearly appears to those skilled in the art, the described sequence of steps can be altered without departing from the scope of the present invention; for example, the P+ deep body regions 40 of the elementary cells 1, and the P+ regions 13 delimiting the portion of the second N− epitaxial layer 2", can be defined before the P type wells 15.

The P type wells 15 can be driven in deeper than the P+ deep body regions 40 and the P+ region 13, to ensure electrical continuity with the P type buried region 12, and to reduce their surface concentration.

Another manufacturing process suitable to provide the PIC structure of FIG. 1 starts with the epitaxial growth of an N type layer over a heavily doped P type substrate 3. The N type epitaxial layer comprises a first portion, with low thickness and medium/high dopant concentration, directly over the substrate 3 and constituting an N+ buffer layer 4, and a second portion, thicker and with low dopant concentration, constituting an N− epitaxial layer 2.

A P type dopant is then selectively introduced into the N− epitaxial layer 2 to form P type wells 15 where the N-channel MOSFETs will be defined (FIG. 12).

A high dose of a P type dopant is then selectively introduced into the N− epitaxial layer 2 to form the P+ deep body regions 40 of the elementary cells 1, and the P+ regions 13 (FIG. 13). As for the previous manufacturing process, the P+ regions 13 are preferably defined together with the P+ deep body regions 40.

A P type dopant is then selectively introduced into the N− epitaxial layer 2 with a high energy implantation technique, so that the resulting doping profile has a peak (a few microns) under the surface of the N− epitaxial layer 2, and the surface concentration is lower than that of the N− epitaxial layer 2. P type buried regions 12 can thus be obtained which, together with the P+ regions 13, isolate the N-channel MOSFETs from the lightly doped N type layer 2 (FIG. 14).

From this point on, the process continues with the same steps of the previously described manufacturing process.

In this case also, the P type well 15 can be driven in deeper than the P+ deep body regions 40 and the P+ region 13, as shown in dash-dot line in FIGS. 12–14.

The two manufacturing processes that have been described in connection with the PIC structure of FIG. 1 can also be used for the fabrication of the PIC structures of FIGS. 2 to 5, with slight modifications obvious to anyone skilled in the art. In particular, to obtain the structures of FIGS. 4 and 5, a known technique such as the one described in the European Patent Application No. 94830028 can be exploited to selectively define the two buffer layer regions 4' and 4".

I claim:

1. A process for manufacturing a PIC structure comprising a vertical IGBT and a driving and control circuit comprising at least first conductivity type-channel MOSFETs, the method comprising the steps of:

a) forming at least one buried region of a second conductivity type within a lightly doped semiconductor layer of a first conductivity type superimposed over a heavily doped semiconductor substrate of the second conductivity type providing a first electrode of the vertical IGBT;

b) selectively introducing a dopant of the second conductivity type into the lightly doped semiconductor layer to form at least one well region of the second conductivity type;

c) selectively introducing a high dose of a dopant of the second conductivity type into the lightly doped semiconductor layer to simultaneously form heavily doped body regions for the IGBT, and at least one heavily doped annular region defining, with a respective buried region, a lightly doped isolated region of the first conductivity type isolated from the lightly doped semiconductor layer and containing at lease one well region of the second conductivity type;

d) forming a gate oxide layer over the lightly doped semiconductor layer;

e) forming a polysilicon layer over the gate oxide layer;

f) selectively removing the polysilicon layer to form insulated gate regions for the IGBT and for the MOSFETs of the driving and control circuitry;

g) selectively introducing a dopant of the second conductivity type into the lightly doped semiconductor layer to form body regions for the IGBT;

h) selectively introducing a high dose of a dopant of the first conductivity type into the heavily doped body regions and the body regions to form a second electrode of the IGBT, and into the well region, at the sides of the insulated gate regions, to form source and drain regions for the MOSFETs of the driving and control circuitry.

2. The process according to claim 1, wherein the lightly doped semiconductor layer comprises a bottom heavily doped layer of the first conductivity type.

3. The manufacturing process according to claim 1, wherein in that step a) further includes the steps of:
   a1) forming a first lightly doped semiconductor layer of the first conductivity type over the heavily doped semiconductor substrate;
   a2) selectively introducing a dopant of the second conductivity type into the first lightly doped semiconductor layer to form at least one region of the second conductivity type;
   a3) forming a second lightly doped semiconductor layer of the first conductivity type over the first lightly doped semiconductor layer and over said at least one region of the second conductivity type.

4. The manufacturing process according to claim 3, wherein seep b) is performed after step c) and before step d).

5. The manufacturing process according to claim 3, wherein said first lightly doped semiconductor layer and said second lightly doped semiconductor layer are epitaxial layers.

6. The manufacturing process according to claim 3, wherein said first lightly doped semiconductor layer and said second lightly doped semiconductor layer have the same resistivity.

7. The manufacturing process according to claim 3, wherein said first lightly doped semiconductor layer and said second lightly doped semiconductor layer have different resistivities.

8. The manufacturing process according to claim 1, wherein step a) further includes the steps of:
   a1) forming a lightly doped semiconductor layer of the first conductivity type over the heavily doped semiconductor substrate;
   a2) selectively implanting at high energy a dopant of the second conductivity type into the lightly doped semiconductor layer to form said at least one buried region of the second conductivity type.

9. The manufacturing process according to claim 8, wherein step a2) is performed after step c) and before step d).

10. The manufacturing process according to claim 8, wherein said lightly doped semiconductor layer is an epitaxial layer.

* * * * *